(12) United States Patent
Iwasaka et al.

(10) Patent No.: US 10,964,564 B2
(45) Date of Patent: Mar. 30, 2021

(54) HEATING TREATMENT APPARATUS AND HEATING TREATMENT METHOD

(71) Applicant: Tokyo Electron Limited, Tokyo (JP)

(72) Inventors: Hideaki Iwasaka, Koshi (JP); Kouichi Mizunaga, Koshi (JP); Takahiro Hayashida, Koshi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 204 days.

(21) Appl. No.: 16/136,793

(22) Filed: Sep. 20, 2018

(65) Prior Publication Data
US 2019/0096716 A1 Mar. 28, 2019

(30) Foreign Application Priority Data
Sep. 22, 2017 (JP) .............................. JP2017-182138

(51) Int. Cl.
| | | |
|---|---|---|
| H01L 21/67 | (2006.01) | |
| F27D 7/06 | (2006.01) | |
| H01L 21/677 | (2006.01) | |
| H01L 21/687 | (2006.01) | |
| F27D 19/00 | (2006.01) | |

(52) U.S. Cl.
CPC .......... *H01L 21/67109* (2013.01); *F27D 7/06* (2013.01); *H01L 21/6719* (2013.01); *H01L 21/67103* (2013.01); *H01L 21/67739* (2013.01); *H01L 21/68742* (2013.01); *F27D 19/00* (2013.01)

(58) Field of Classification Search
CPC ......... H01L 21/67109; H01L 21/68742; H01L 21/67103; H01L 21/6719; H01L 21/67739; H01L 21/67098; H01L 21/67115; F27D 7/06; F27D 19/00
See application file for complete search history.

(56) References Cited

FOREIGN PATENT DOCUMENTS

| | | | |
|---|---|---|---|
| JP | 09326341 | * | 12/1997 |
| JP | H09-326341 A | | 12/1997 |

* cited by examiner

*Primary Examiner* — Shawntina T Fuqua
(74) *Attorney, Agent, or Firm* — Pearne & Gordon LLP

(57) ABSTRACT

A side surface unit of a heat treatment space S is formed by a shutter member 250 including an outer shutter 260 and an inner shutter 270. Supply air A is supplied as a horizontal laminar flow toward a wafer W from a lower end side of the shutter member 250, that is, from a gap $d_1$ located on the level with the wafer W placed on a heat plate 211 of a mounting table 210. Supply air B is supplied into the heat treatment space S from an upper end side of the shutter member 250, that is, from a gap $d_2$ positioned higher than the wafer W. A ratio between a flow rate of the supply air A and a flow rate of the supply air B is 4:1.

10 Claims, 7 Drawing Sheets

HEATING TREATMENT APPARATUS AND HEATING TREATMENT METHOD

CROSS-REFERENCE TO RELATED APPLICATION

This application claims the benefit of Japanese Patent Application No. 2017-182138 filed on Sep. 22, 2017, the entire disclosures of which are incorporated herein by reference.

TECHNICAL FIELD

The various aspects and embodiments described herein pertain generally to a heating treatment apparatus and a heating treatment method.

BACKGROUND

In the manufacture of a semiconductor device, to dry a coating film such as a resist film formed on a substrate such as a semiconductor wafer (hereinafter, simply referred to as "wafer"), a heating treatment is performed on this semiconductor wafer.

Conventionally, such a heating treatment is performed by using a heating treatment apparatus. In performing this heating treatment, it is required to heat the substrate uniformly as it affects uniformity of a film thickness.

In consideration of this requirement, a conventional heating treatment apparatus is equipped with a placing table for mounting the substrate thereon; a housing configured to accommodate the placing table and form a processing space therein; a shutter member provided around the placing table to surround the placing table; an elevating device configured to move the shutter member up and down; a cover member configured to cover an upper portion of the processing space within the housing and connected to a gas exhaust line at a central portion thereof; and gas holes arranged along a circumferential direction thereof (Patent Document 1). A ring-shaped air rectifying plate configured to form an annular air flow inlet between the ring-shaped air rectifying plate and a peripheral portion of the cover member when the shutter member is raised is further provided.

With this configuration, a downflow in the vicinity of the apparatus can be uniformly introduced into the processing space from a circumferential direction of the processing space. As a result, a local decrease of a temperature of the wafer as a result of a direct contact with the downflow introduced from a wafer entrance can be suppressed, so that a hindrance to achieving thickness uniformity of the resist film can be improved.

Patent Document 1: Japanese Patent Laid-open Publication No. H09-326341

SUMMARY

In the heating treatment apparatus disclosed in the aforementioned Patent Document 1, however, since the downflow of air (typically having a temperature of 23° C.) is introduced into the processing space only from above the processing space within the housing, a center-oriented descending airflow is created in a heat atmosphere within the processing space. As a result, a stagnation of the airflow is generated between the descending airflow and an inner wall of the shutter member, and a sublimated matter may float in this stagnation and leak to the outside from an apparatus gap. To suppress the leakage of the sublimated matter by suppressing the generation of the stagnation, an exhaust rate needs to be increased. In this regard, there is still a room for improvement from the viewpoint of energy saving.

In view of the foregoing, exemplary embodiments provide a technique capable of suppressing generation of stagnation of an airflow within a processing space in a heating treatment apparatus for a substrate, thus allowing a sublimated matter to be exhausted at a smaller exhaust rate as compared to conventional cases.

In one exemplary embodiment, there is provided a heating treatment apparatus configured to heat a substrate having a coating film formed thereon. The heating treatment apparatus includes a placing table configured to place the substrate thereon; a heating device configured to heat the substrate placed on the placing table; a top surface unit provided above the placing table and configured to cover the placing table; and a side surface unit configured to surround the placing table and located at an outer periphery of the placing table. A heat treatment space is formed by the placing table, the top surface unit and the side surface unit. An exhaust unit configured to exhaust an atmosphere within the heat treatment space is provided at a central portion of the top surface unit. A first gas inlet and a second gas inlet are provided in a circumferential direction of the side surface unit and through which a gas is supplied into the heat treatment space. A height position of the first gas inlet is on a level with a height position of the substrate placed on the placing table, and a height position of the second gas inlet is higher than the height position of the first gas inlet. A flow rate of the gas introduced into the heat treatment space from the first gas inlet is larger than a flow rate of the gas introduced into the heat treatment space from the second gas inlet.

According to the exemplary embodiment, the first gas inlet and the second gas inlet through which the gas is supplied into the heat treatment space are provided, and the height position of the first gas inlet is on the level with the substrate placed on the placing table. Accordingly, it is possible to supply a horizontal laminar flow toward a surface of the substrate on the placing table. Further, the height position of the second gas inlet is higher than the height position of the first gas inlet, and the flow rate of the gas supplied into the heat treatment space from the first gas inlet is larger than the flow rate of the gas supplied into the heat treatment space from the second gas inlet. Therefore, generation of a stagnation of an airflow within the heat treatment space is suppressed due to the gas supplied from the second gas inlet. As a result, when exhausting the atmosphere within the heat treatment space, the atmosphere can be exhausted at a smaller exhaust rate than in conventional cases while suppressing leakage of the sublimated matter.

A ratio between the flow rate of the gas introduced into the heat treatment space from the first gas inlet and the flow rate of the gas introduced into the heat treatment space from the second gas inlet is in a range from 9:1 to 6:4. More desirably, the flow rate ratio may be in a range from 5:1 to 7:3. Still more desirably, the flow rate ratio may be 4:1.

Further, according to the investigation of the present inventors, it is deemed that the higher the height position of the second gas inlet is, the better it may be. Further, it is deemed that an effect of suppressing the generation of the stagnation can be achieved by providing the second gas inlet at a height position higher than a half of a height of the heat treatment space, and, further, that the generation of the stagnation can be suppressed more effectively as the second gas inlet is located as close to the top surface unit of the heat treatment space as possible. As will be described in the following exemplary embodiment, it is most desirable that the second gas inlet is located at the top surface unit of the heat treatment space (the topmost portion of the heat treatment space).

In another exemplary embodiment, there is provided a heating treatment apparatus configured to heat a substrate having a coating film formed thereon. The heating treatment apparatus includes a placing table configured to place the substrate thereon; a heating device configured to heat the substrate placed on the placing table; a top surface unit provided above the placing table and configured to cover the placing table; and a side surface unit configured to surround the placing table and located at an outer periphery of the placing table. A heat treatment space is formed by the placing table, the top surface unit and the side surface unit. An exhaust unit configured to exhaust an atmosphere within the heat treatment space is provided at a central portion of the top surface unit. A first gas inlet and a second gas inlet are provided in a circumferential direction of the side surface unit and through which a gas is supplied into the heat treatment space. A height position of the first gas inlet is on a level with a height position of the substrate placed on the placing table, and a height position of the second gas inlet is higher than the height position of the first gas inlet. The first gas inlet is larger than the second gas inlet.

According to the present exemplary embodiment, since the first gas inlet is larger than the second gas inlet, a pressure loss of the second gas inlet is large when a downflow in a region where the heating treatment apparatus is provided is introduced into the heat treatment space. Therefore, a flow rate of the gas supplied from the first gas inlet can be set to be larger than a flow rate of the gas supplied from the second gas inlet. Accordingly, the gas supplied from the second gas inlet can be used to suppress the generation of the stagnation within the heat treatment space, so that the generation of the stagnation within the heat treatment space can be suppressed. Therefore, when exhausting the atmosphere within the heat treatment space, it is possible to exhaust the sublimated matter at a smaller exhaust rate as compared to the conventional cases.

A ratio between a size of the first gas inlet, that is, a cross sectional area of an opening of the first gas inlet and a size of the second gas inlet, that is, a cross sectional area of an opening of the second gas inlet may be in a range from 9:1 to 6:4. More desirably, the ratio may be in a range from 5:1 to 7:3. Still more desirably, the ratio may be 4:1.

The side surface unit may be implemented by a shutter member allowed to be moved up and down.

When the substrate is heated, the shutter member may be moved up, and the second gas inlet may be formed by a gap between an upper end portion of the shutter member and the top surface unit.

The shutter member may include an outer shutter and an inner shutter configured as one body. The first gas inlet may communicate with a path formed between the outer shutter and the inner shutter.

The outer shutter may have a hollow structure.

In still another exemplary embodiment, there is provided a heating treatment method of heating a substrate, which has a coating film formed thereon, on a placing table within a heat treatment space. The heating treatment method includes supplying, when heating the substrate, a gas horizontally toward the heat treatment space at a height position on a level with the substrate on the placing table from an outside of the heat treatment space, and supplying the gas toward the heat treatment space at a height position higher than the substrate on the placing table from the outside of the heat treatment space, while exhausting an atmosphere within the heat treatment space from above a center of the heat treatment space. A flow rate of the gas supplied from the height position on the level with the substrate is set to be larger than a flow rate of the gas supplied from the height position higher than the substrate.

A ratio between the flow rate of the gas supplied from the height position on the level with the substrate and the flow rate of the gas supplied from the height position higher than the substrate is in a range from 9:1 to 6:4. More desirably, the flow rate ratio may be in a range from 5:1 to 7:3. Still more desirably, the flow rate ratio may be 4:1.

According to the exemplary embodiments, it is possible to suppress the generation of the stagnation of the airflow in the heat treatment space, and when exhausting the atmosphere within the heat treatment space, it is possible to exhaust the sublimated matter within the heat treatment space at a smaller exhaust rate as compared to the conventional cases.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
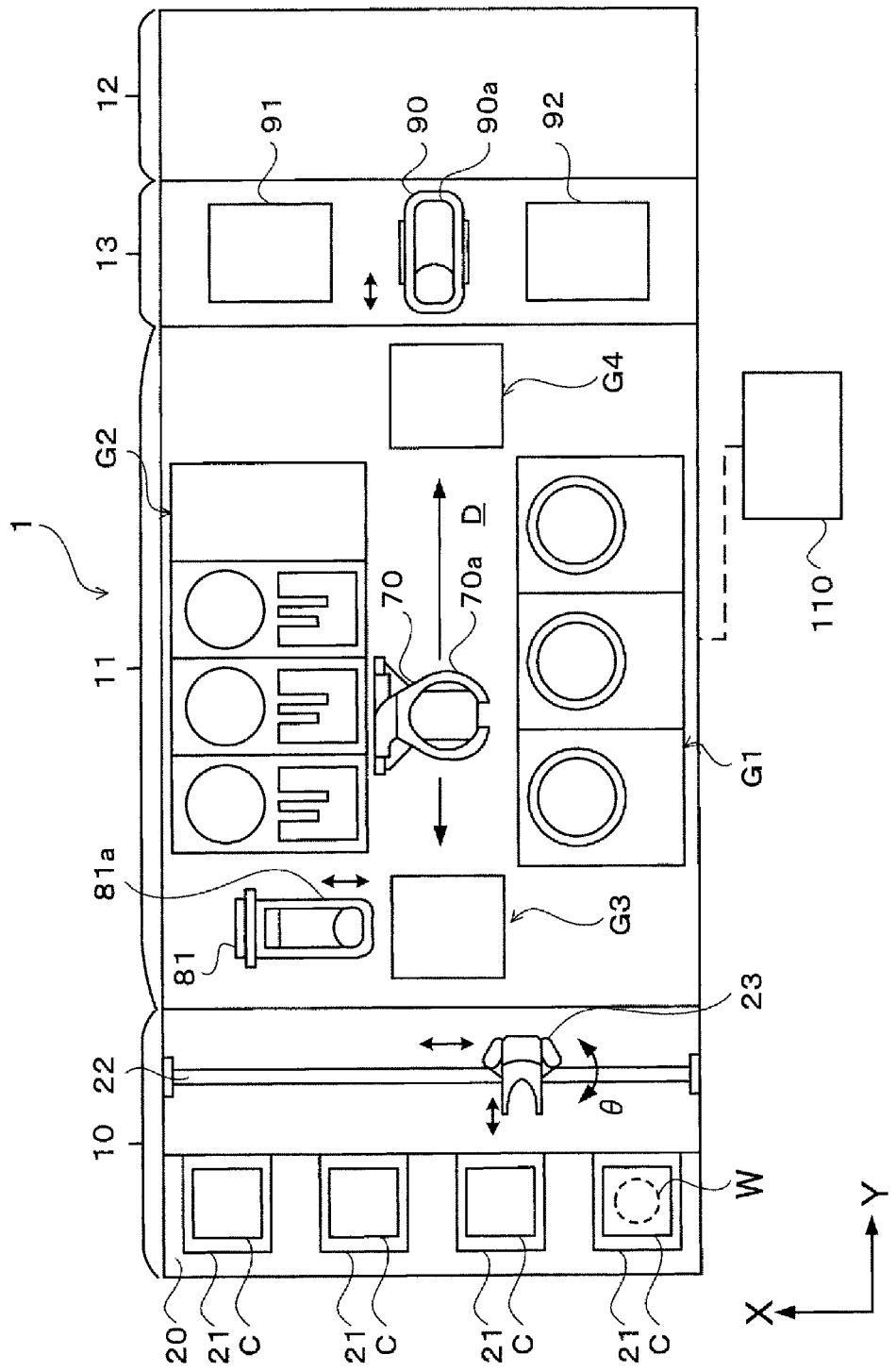
FIG. 1 is a plan view schematically illustrating a substrate processing system equipped with a heating treatment apparatus according to an exemplary embodiment.

In the following detailed e, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described in detail with reference to the accompanying drawings. In the specification and the drawings, parts having substantially same configuration and function will be assigned same reference numerals, and redundant description will be omitted.

<Substrate Processing System>

Figure 2:
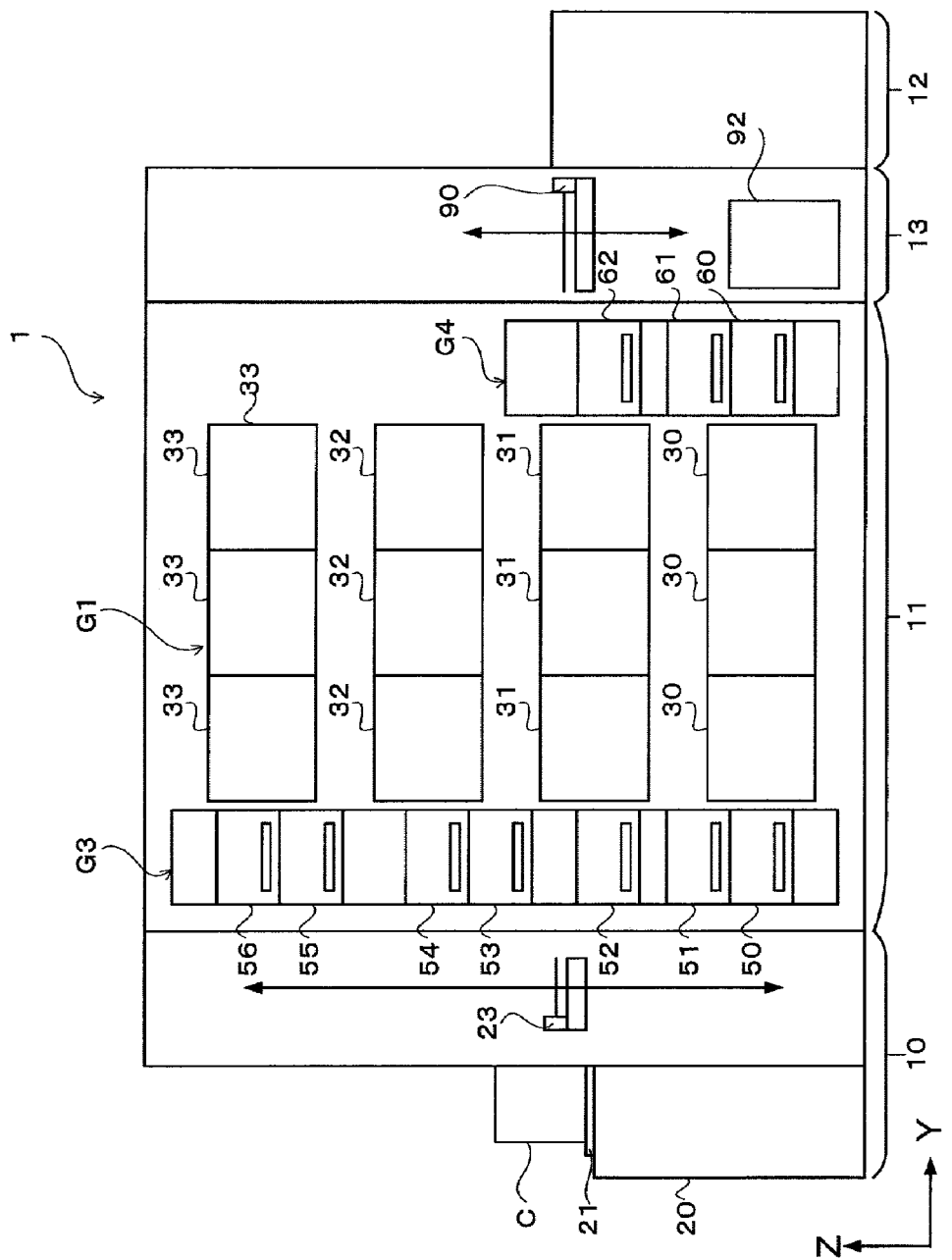
FIG. 2 is a front view of the substrate processing system of FIG. 1.
Figure 3:
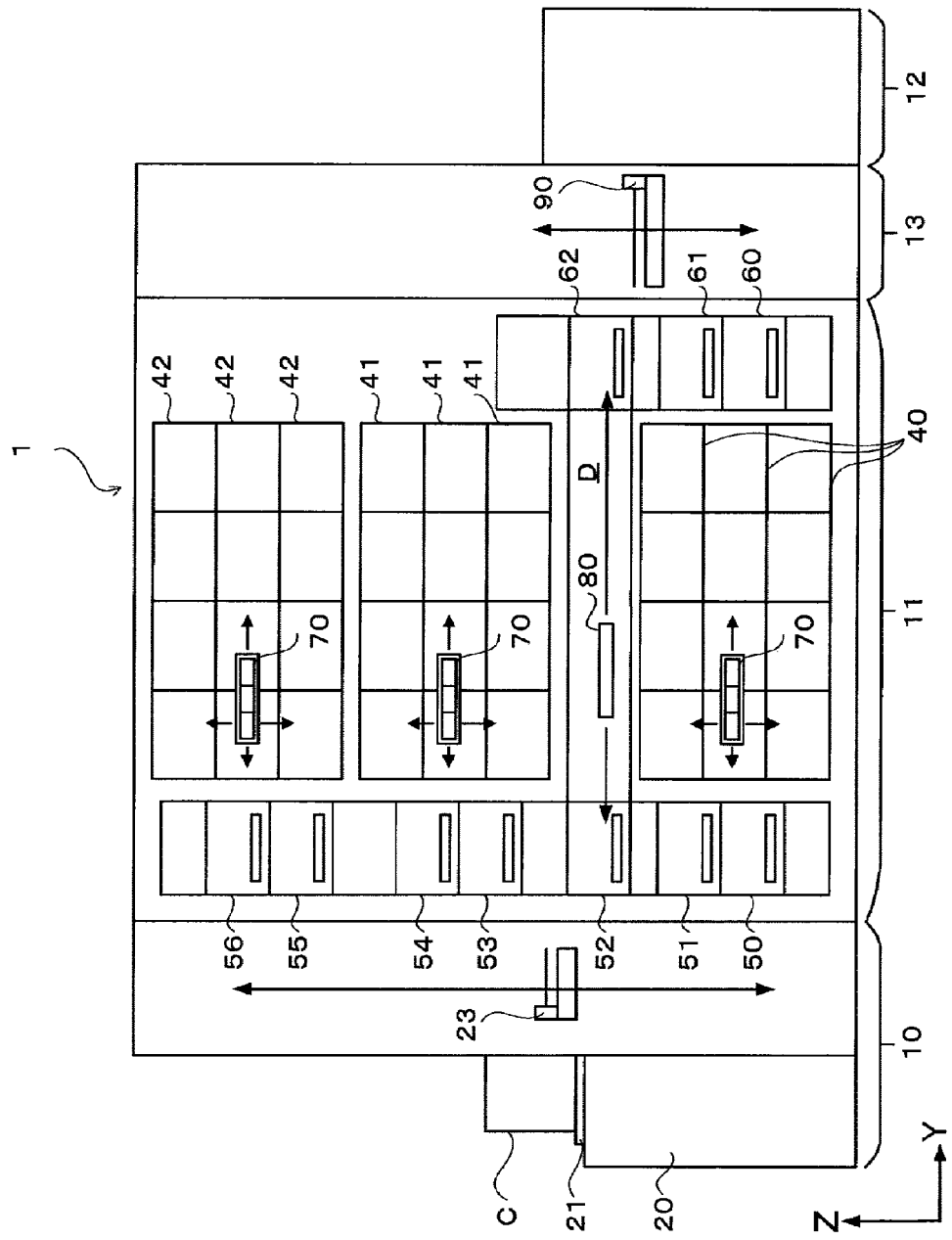
FIG. 3 is a rear view of the substrate processing system of FIG. 1.

First, a configuration of a substrate processing system equipped with a heating treatment apparatus according to an exemplary embodiment will be explained. FIG. 1 is a plan view schematically illustrating a configuration of a substrate processing system 1. FIG. 2 and FIG. 3 are a front view and a rear view schematically illustrating an internal configuration of the substrate processing system 1. In the substrate processing system 1, a preset processing is performed on a wafer W as a processing target substrate.

The substrate processing system 1 is equipped with, as depicted in FIG. 1, a cassette station 10 into/from which a cassette C accommodating therein a multiple number of wafers W is carried; a processing station 11 equipped with a plurality of processing apparatuses respectively configured to perform the preset processings on the wafer W; and an interface station 13 configured to transfer the wafer W between the processing station 11 and an exposure apparatus 12 disposed adjacent to the processing station 11.

A cassette placing table 20 is provided in the cassette station 10. The cassette placing table 20 is provided with a plurality of cassette placing plates 21 configured to place thereon cassettes C when the cassettes C are carried to/from the outside of the substrate processing system.

The cassette station 10 is equipped with a wafer transfer device 23 configured to be movable on a transfer path 22 which is extended in the X direction as shown in FIG. 1. The wafer transfer device 23 is also configured to be movable up and down and rotatable around a vertical axis (θ direction) and is capable of transferring the wafers W between the cassette C on each cassette placing plate 21 and a transit device of a third block G3 of the processing station 11 to be described later.

The processing station 11 is provided with a plurality of, for example, four blocks, that is, a first block G1 to a fourth block G4 each of which is equipped with various kinds of apparatuses. By way of example, a second block G2 is provided at a rear side (the positive X-axis side of FIG. 1, upper side of the drawing) of the processing station 11. Further, the aforementioned third block G3 is provided at a side of the cassette station 10 (the negative Y-axis side of FIG. 1) of the processing station 11, and the fourth block G4 is disposed at a side of the interface station 13 (the positive Y-axis side of FIG. 1) of the processing station 11.

By way of example, the first block G1 accommodates therein a plurality of liquid processing apparatuses, as shown in FIG. 2. By way of example, developing apparatuses 30 configured to perform a developing processing on the wafer W, lower antireflection film forming apparatuses 31 configured to form an antireflection film (hereinafter, referred to as "lower antireflection film") under a processing target film of the wafer W, resist coating apparatuses 32 as processing liquid coating apparatuses configured to form the processing target film by coating a resist on the wafer W, and upper antireflection film forming apparatuses 33 configured to form an antireflection film (hereinafter, referred to as "upper antireflection film") on the processing target film of the wafer W are arranged in this sequence from the bottom.

For example, a number of the developing apparatuses 30 is three, and these three developing apparatuses 30 are horizontally arranged. Likewise, a number of the lower antireflection film forming apparatuses 31 is three, and these three lower antireflection film forming apparatuses 31 are arranged horizontally. Further, a number of the resist coating apparatuses 32 is three, and these three resist coating apparatuses 32 are arranged horizontally. Also, a number of the upper antireflection film forming apparatuses 33 is three, and these three upper antireflection film forming apparatuses 33 are arranged horizontally. Here, the numbers of the developing apparatuses 30, the lower antireflection film forming apparatuses 31, the resist film forming apparatuses 32 and the upper antireflection film forming apparatuses 33 and the arrangements thereof may be modified as required.

In each of these developing apparatuses 30, lower antireflection film forming apparatuses 31, resist coating apparatuses 32 and upper antireflection film forming apparatuses 33, spin coating of coating a preset processing liquid on the wafer W is performed, for example. In the spin coating, the processing liquid is discharged onto the wafer W from, for example, a coating nozzle, and the processing liquid is diffused on a surface of the wafer W by rotating the wafer W.

By way of example, within the second block G2, as shown in FIG. 3, heating treatment apparatuses 40 configured to perform a heating treatment of the wafer W, hydrophobizing apparatuses 41 configured to perform a hydrophobizing processing to improve adhesivity between the resist liquid and the wafer W, and periphery exposure apparatuses 42 configured to perform exposure to a peripheral portion of the wafer W are arranged in the vertical direction and in the horizontal direction. The numbers and the arrangements of the heat treatment apparatuses 40, the hydrophobizing apparatuses 41 and the periphery exposure apparatuses 42 may be modified as required.

By way of example, within the third block G3, a multiple number of transit devices 50, 51, 52, 53, 54, 55 and 56 are arranged in sequence from the bottom. Further, within the fourth block G4, a plurality of transit devices 60, 61 and 62 are arranged in sequence from the bottom.

As depicted in FIG. 1, a wafer transfer region D is formed in an area surrounded by the first block G1 to the fourth block G4. Multiple wafer transfer devices 70 each of which has a transfer arm 70a configured to be movable in the Y, X, θ and up-and-down directions are disposed within the wafer transfer region D. The wafer transfer devices 70 are moved within the wafer transfer region D and capable of moving the wafers W to preset apparatuses within the first to fourth blocks G1 to G4.

Further, also provided in the wafer transfer region D is a shuttle transfer device 80 which is configured to transfer the wafer W between the third block G3 and the fourth block G4 linearly as illustrated in FIG. 3.

By way of example, the shuttle transfer device 80 is configured to be movable linearly in the Y direction of FIG. 3. The shuttle transfer device 80 is capable of transferring the wafer W between the transit device 52 of the third block G3 and the transit device 62 of the fourth block G4 by being moved in the Y direction while holding the wafer W.

As depicted in FIG. 1, a wafer transfer device 81 is provided at the positive X-axis side of the third block G3. The wafer transfer device 81 is equipped with a transfer arm 81a configured to be movable in the X, θ and up-and-down directions. The wafer transfer device 81 is capable of transferring the wafer W into the transit devices within the third block G3 by being moved up and down while holding the wafer W with the transfer arm 81a.

The interface station 13 accommodates therein a wafer transfer device 90 and transit devices 91 and 92. For example, the wafer transfer device 90 is equipped with a transfer arm 90a configured to be movable in the Y, θ and up-and-down directions. The wafer transfer device 90 is capable of transferring the wafer W between each transit device within the fourth block G4, the transit devices 91 and 92 and the exposure apparatus 12 while holding the wafer W with the transfer arm 90a, for example.

The above-described substrate processing system 1 includes a control unit 110, as illustrated in FIG. 1. The control unit 110 is implemented by, for example, a computer and equipped with a program storage unit (not shown). The program storage unit stores therein a program for controlling a processing on the wafer W within the substrate processing system 1. Further, the program may be recorded in a computer-readable recording medium such as a hard disk (HD), a flexible disk (FD), a compact disk (CD), a magnet optical disk (MO) or a memory card and may be installed to the control unit 110 from this recording medium.

<Configuration of Heating Treatment Apparatus>

Now, a configuration of the heating treatment apparatus 40 according to the exemplary embodiment will be explained with reference to FIG. 4.

Figure 4:
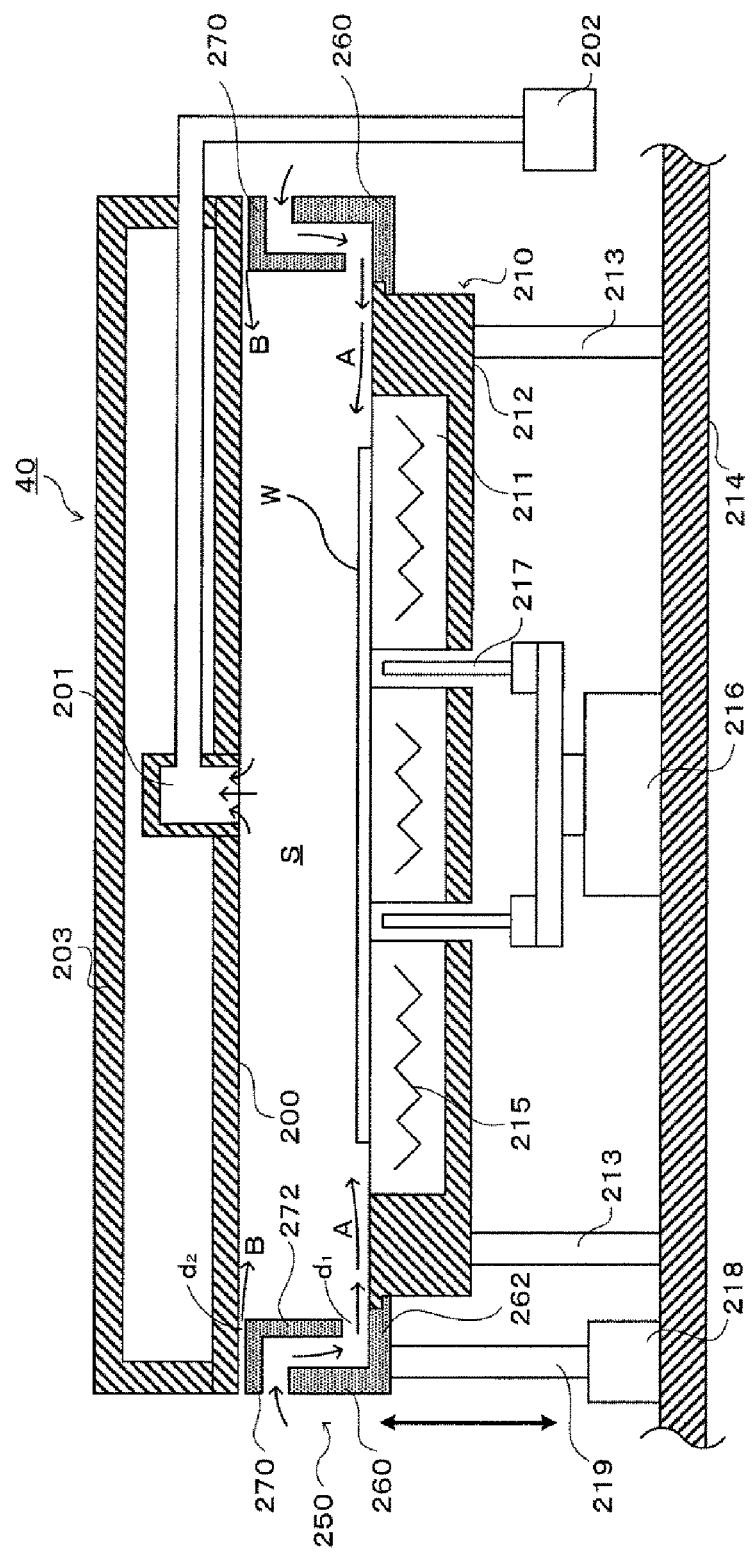
FIG. 4 is a schematic side sectional view illustrating a schematic configuration of the heating treatment apparatus according to the exemplary embodiment.

FIG. 4 illustrates a schematic configuration of the heating treatment apparatus 40. In the heating treatment apparatus 40, a heat treatment space S is formed by a ceiling plate 200 forming a top surface unit, a placing table 210 disposed to face the ceiling plate 200 and a shutter member 250 forming a side surface unit.

An exhaust port 201 configured as an exhaust unit is provided at a center of the ceiling plate 200. This exhaust port 201 communicates with an exhaust device 202 provided at an outside of the heating treatment apparatus 40, for example. A heat protection body 203 is provided on a top surface of the ceiling plate 200.

The placing table 210 is equipped with a heat plate 211 configured as a placing unit on which the wafer W is placed; and a heat plate supporting member 212 configured to support the heat plate 211. The heat plate supporting member 212 is supported at a base 214 forming a bottom portion of the heating treatment apparatus 40 with a multiple number of supporting columns 213 therebetween. The heat plate 211 has a heater 215 embedded therein.

The base 214 is provided with a supporting pin elevating mechanism 216, and supporting pins 217 provided at the supporting pin elevating mechanism 216 are moved up and down by the supporting pin elevating mechanism 216. Accordingly, the supporting pins 217 can be protruded upwards from the heat plate 211, and the wafer W can be delivered between the supporting pins 217 and the transfer arm 70a of the aforementioned wafer transfer device 70.

Figure 5:
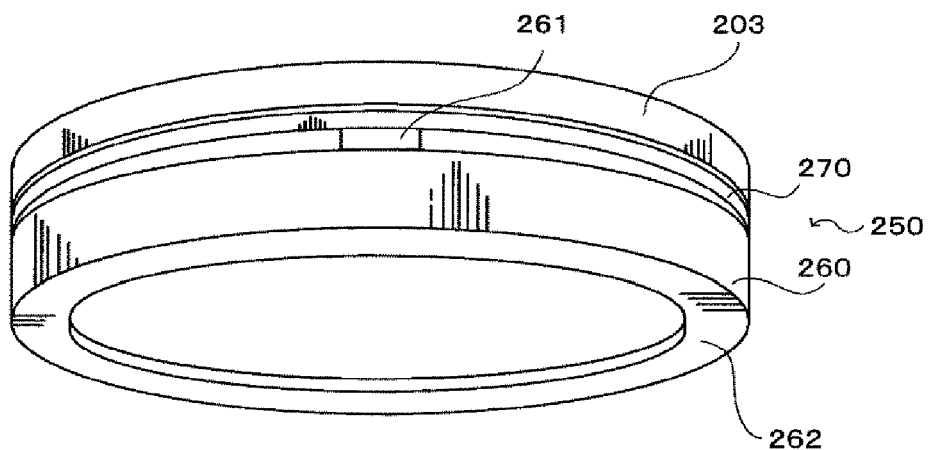
FIG. 5 is a perspective view of a shutter member in the heating treatment apparatus of FIG. 4.

In the present exemplary embodiment, the side surface unit of the heating treatment apparatus 40 is formed by the shutter member 250 having a ring shape. The shutter member 250 includes an outer shutter 260 provided at an outer side; and an inner shutter 270 provided at an inner side with a gap with respect to the outer shutter 260. As depicted in FIG. 5, the outer shutter 260 and the inner shutter 270 are connected as one body by a fixing member 261, for example. Fixed at a bottom portion 262 of the outer shutter 260 is an elevating member 219 configured to be moved up and down by an elevating mechanism 218 which is provided at the base 214. Accordingly, if the elevating member 219 is moved up and down, the shutter member 250 is also moved up and down. That is, the outer shutter 260 and the inner shutter 270 are moved up and down as one body.

Figure 6:
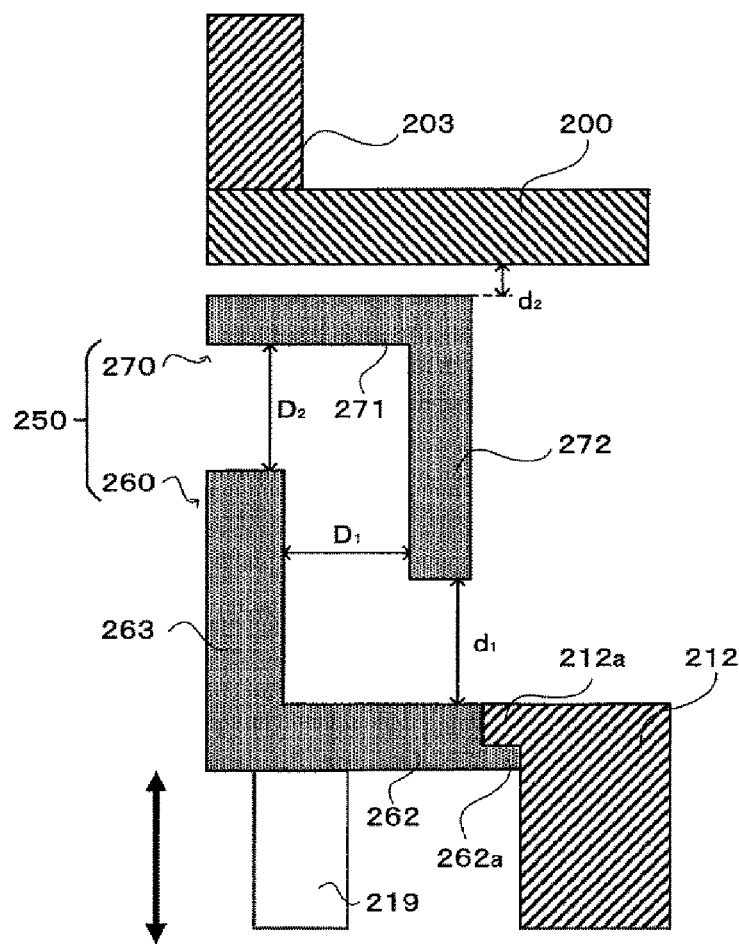
FIG. 6 is an enlarged view of explaining the shutter member in the heating treatment apparatus of FIG. 4.

As shown in FIG. 6, the outer shutter 260 is provided with the bottom portion 262 and a sidewall portion 263 configured as an outer peripheral surface. Further, an engagement portion 262a formed as a step-shaped portion is provided at an inner end portion of the bottom portion 262, and this engagement portion 262a is engaged with an outer end portion 212a of the heat plate supporting member 212. Accordingly, the outer end portion 212a of the heat plate supporting member 212 serves as a stopper, and the shutter member 250 is suppressed from being raised over a predetermined range. Further, the state shown in FIG. 6, that is, the state in which the shutter member 250 is completely raised is a state when a heating treatment is performed on the wafer W.

The inner shutter 270 is provided with a horizontal portion 271 having a circular ring shape; and a suspended portion 272 provided at an inner end portion of the horizontal portion 271. The inner shutter 270 and the outer shutter 260 are configured as one body with preset gaps therebetween, as will be described below.

That is, a gap $d_1$ formed between a lower end surface of the suspended portion 272 of the inner shutter 270 and a top surface of the bottom portion 262 of the outer shutter 260 along the entire circumference thereof is set to be, for example, 2 mm. A gap $D_1$ formed between an outer surface of the suspended portion 272 of the inner shutter 270 and an inner surface of the sidewall portion 263 of the outer shutter 260 is set to be, for example, 2 mm. A gap $D_2$ between a bottom surface of the horizontal portion 271 of the inner shutter 270 and an upper end surface of the sidewall portion 263 of the outer shutter 260 is set to be, for example, 2 mm. In the present exemplary embodiment, a condition of gaps $D_1$, $D_2 \geq$ gap $d_1$ needs to be satisfied.

In the state shown in FIG. 6, that is, in the state that the shutter member 250 is completely raised, a gap $d_2$ is formed between a bottom surface of the ceiling plate 200 and a top surface of the horizontal portion 271 of the inner shutter 270 along the entire circumference thereof. In this example, the gap $d_2$ is set to be, for example, 0.5 mm.

The aforementioned gap $d_1$ serves as a first gas inlet having a slit shape, and the gap $d_2$ serves as a second gas inlet having a slit shape. Accordingly, in the present exemplary embodiment, the first gas inlet and the second gas inlet has a size ratio of 4:1. Further, a height position of the gap $d_1$ serving as the first gas inlet is on a level with a height position of the wafer W placed on the heat plate 211 of the placing table 210. That is, in the state where the shutter member 250 is completely raised, a position of a top surface of the wafer W is within a vertical range of the gap $d_1$ which serves as the first gas inlet.

<Operation of Heating Treatment Apparatus>

The heating treatment apparatus 40 according to the exemplary embodiment has the above-described configuration. Now, an operation of the heating treatment apparatus 40 and so forth will be explained.

Figure 7:
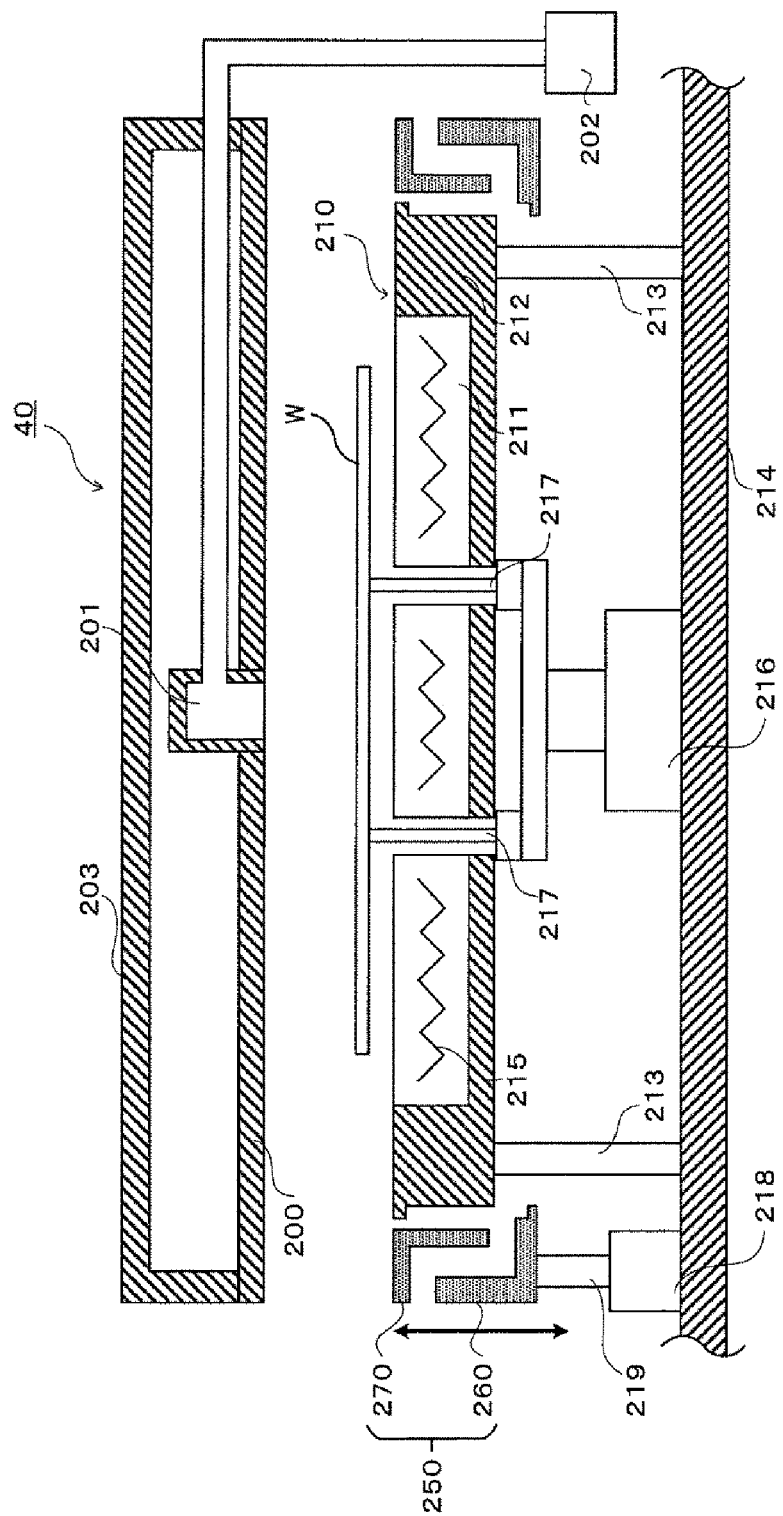
FIG. 7 is a diagram illustrating a state in which a wafer is carried into/out of the heating treatment apparatus of FIG. 4.

First, as depicted in FIG. 7, in a state where the shutter member 250 is lowered and the supporting pins 217 are raised, the wafer W as a heating target is transferred to above the heat plate 211 of the placing table 210 and placed on the supporting pins 217 by the transfer arm 70a of the wafer transfer device 70 of the substrate processing system 1. Then, the transfer arm 70a is retreated, and the supporting pins 217 are lowered, so that the wafer W is placed on the heat plate 211. Thereafter, the shutter member 250 is raised, so that a heating treatment state shown FIG. 4 is created. That is, the heat treatment space S is formed by the ceiling plate 200, the placing table 210 and the shutter member 250. Further, the exhaust device 202 is driven constantly.

In this state, the wafer W placed on the heat plate 211 of the placing table 210 is subjected to a heating treatment by being heated with the heater 215. At this time, from a lower end side of the shutter member 250 configured as the side surface unit of the heating treatment apparatus, a downflow of air is supplied from the gap $d_1$ serving as the first gas inlet.

That is, as the exhaust device 202 is driven, the inside of the heat treatment space S is set to be of a negative pressure by being evacuated through the exhaust port 201 provided at the center of the ceiling plate 200. Meanwhile, within the substrate processing system 1 in which the heating treatment apparatus 40 is provided, clean air having a room temperature of, e.g., 23° C. always flows downwards from above, so that a downflow of the air is formed therein. Accordingly, as depicted in FIG. 4, the downflow of the air is introduced from the gaps $D_2$ and $D_1$ at the lower side of the shutter member 250 to be supplied into the heat treatment space S from the gap $d_1$ as supply air A. Further, the downflow of the air is also introduced from the gap $d_2$ at an upper end side of the shutter member 250 to be supplied into the heat treatment space S as supply air B.

Here, as stated above, as the size ratio of the gap $d_1$ and the gap $d_2$ is 4:1, a flow rate ratio of the supply air A and the supply air B is also 4:1. As shown in FIG. 4, the supply air A is flown horizontally as a laminar flow toward the wafer W along the entire circumference thereof from the lower end side of the shutter member 250 forming the side surface unit, that is, from the gap $d_1$ located on the level with the wafer W placed on the heat plate 211 of the mounting table 210. Meanwhile, the supply air B from an upper end side of the shutter member 250 forming the side surface unit, that is, from the gap $d_2$ is supplied to above the heat treatment space S at a flow rate equivalent to ¼ of a flow rate of the supply air A. Accordingly, the stagnation of the airflow, which has been conventionally generated in the space above the side portion of the heat treatment space S, is suppressed from being generated.

Therefore, the sublimated matter generated in the heat treatment space S when the heating treatment is performed does not stay or float in the heat treatment space S but is exhausted from the exhaust port 201 smoothly, so that the leakage of the sublimated matter is suppressed.

Since the stagnation does not occur in the heat treatment space S and the exhaust of the sublimated matter is performed more smoothly as compared to conventional cases as stated above, an exhaust amount by the exhaust device 202 is reduced as compared to the conventional cases. Therefore, an energy saving effect can be improved. According to the investigation of the present inventors, an exhaust rate of 70 L/min is required to suppress the leakage of the sublimated matter in the conventional heating treatment apparatus of the same kind and the same size. According to the present exemplary embodiment, however, the leakage of the sublimated matter is not observed even with the exhaust rate of 30 L/min.

Here, "the suppressing of the generation of the stagnation" also implies suppressing generation of a turbulence. Accordingly, it is possible to suppress degradation of uniformity in a film thickness of a coating film on a surface of the wafer W, which might be caused as the way whereby the coating film is dried is locally changed due to the turbulence.

Further, if the exhaust rate from the center of the ceiling portion is increased to suppress the leakage of the sublimated matter as in the conventional cases, the film thickness at the central portion of the wafer W tends to be increased. According to the present exemplary embodiment, however, since the exhaust rate is reduced as compared to the conventional cases, such a tendency can be reduced, which contributes to improvement of uniformity in the film thickness.

The supply air A is introduced from the gap $D_2$ to be supplied from the gap $d_1$ via the gap $D_1$. Here, however, as a temperature of the suspended portion 272 of the inner shutter 270 of the shutter member 250 is raised due to the heat atmosphere within the heat treatment space S or the like, the downflow of the air is heated when it flows in a path formed by the gaps $D_2$ and $D_1$. Accordingly, when the supply air A reaches the heat treatment space S from the gap $d_1$, the temperature of the supply air A is higher than the temperature (e.g., 23° C.) of the downflow of the air. Therefore, when the supply air A reaches the wafer W, as compared to the conventional case where the supply air comes into contact with the wafer W while being maintained at the substantially room temperature, an amount of heat deprived from the wafer W is reduced. Further, since the supply air A does not flow toward the wafer W from above the wafer W, unlike in the conventional cases, no physical impact is inflicted on the coating film on the surface of the wafer W when the airflows comes into contact with the wafer W.

Further, since not only a thermal influence upon the wafer W is small but a thermal influence upon surfaces of the members forming the heat treatment space S from the downflow of the air is also small, a risk that the sublimated matter adheres to the surfaces of the members forming the heat treatment space S including the suspended portion 272 of the inner shutter 270 is also lowered.

As a result of investigating constant temperature accuracy on the surface of the wafer W when the heating treatment is actually performed, an average discrepancy of 0.50% is observed in the conventional heating treatment apparatus when the heating treatment is performed at a temperature of 240° C. In the heating treatment apparatus 40 according to the exemplary embodiment, however, the average discrepancy is found to be suppressed to 0.30%.

That is, the thermal influence from the gas introduced from the outside of the heat treatment space S upon the wafer W is reduced as compared to the conventional cases. In this point of view, the heating of the wafer W can be performed more uniformly than in the conventional cases, so that the uniformity of the film thickness can be improved.

Furthermore, since the path formed by the gaps $D_2$ and $D_1$ in the shutter member 250 also serves as a heat insulation space, heat dissipation from the outer shutter 260 is suppressed, and the thermal influence upon various kinds of devices and apparatuses around the heating treatment apparatus 40 is reduced.

<Another Configuration Example of Heating Treatment Apparatus>

In the above-described exemplary embodiment, though the size ratio between the gap $d_1$ as the first gas inlet and the gap $d_2$ as the second gas inlet is set to be 4:1, the size ratio is not limited thereto but may be set to be in a range from 9:1 to 6:4 or 5:1 to 7:3.

Further, in the above-described exemplary embodiment, the flow rate of the gas from the first gas inlet is set to be larger than the flow rate of the gas from the second gas inlet by adjusting the size ratio of the gap d1 as the first gas inlet and the gap d2 as the second gas inlet. However, the preset flow rate ratio may be obtained by setting the flow rate from the first gas inlet to be larger than the flow rate of the gas from the second gas inlet not while setting the sizes of those inlets to be of the mentioned ratio but while adjusting a pressure loss by allowing path communicating with the gaps $d_1$ and $d_2$ to have a labyrinth structure or changing a size of the inlet of the downflow.

Furthermore, in the above-stated exemplary embodiment, each of the first gas inlet and the second gas inlet is implemented by the gap having the slit shape (the gap $d_1$ and the gap $d_2$, respectively). Without being limited thereto, however, each of the first gas inlet and the second gas inlet may be implemented by a plurality of fine holes.

Figure 8:
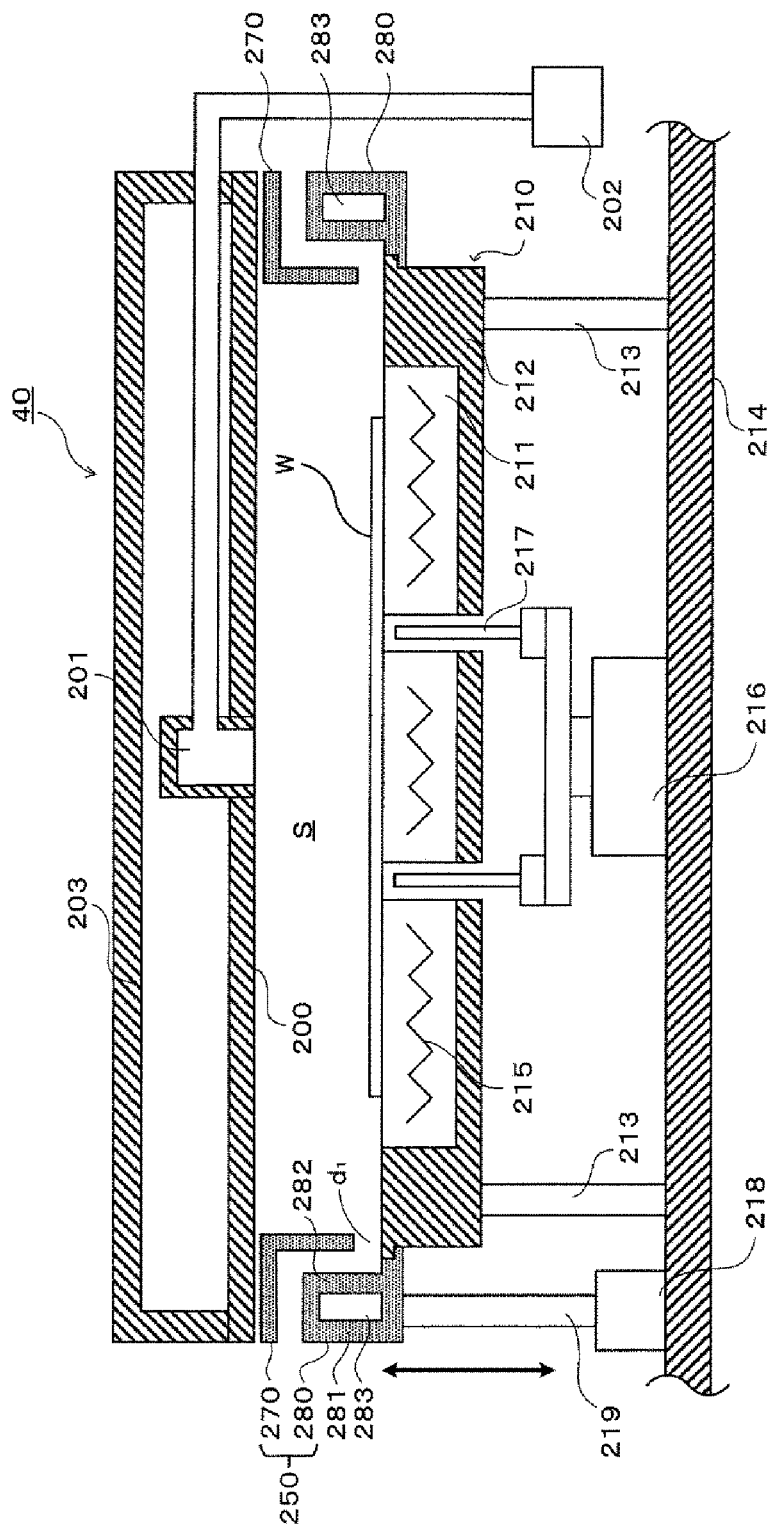
FIG. 8 is a schematic side sectional view illustrating a schematic configuration of a heating treatment apparatus in which an outer shutter of a shutter member has a hollow structure.

Moreover, in the above-described exemplary embodiment, the shutter 250 has a so-called dual-ring shutter structure in which the outer shutter 260 and the inner shutter 270 are provided. As depicted in FIG. 8, however, the shutter 250 may have a triple-ring shutter structure in which the outer shutter 280 has a hollow structure.

That is, in an outer shutter 280 in the shutter member 250 of the heating treatment apparatus 40 shown in FIG. 8, a space 283 is provided between an outer sidewall portion 281 and an inner sidewall portion 282. Accordingly, since the space 283 serves as the heat insulation space, the heat dissipation from the outer shutter 280 and the thermal influence upon the various devices and apparatuses around the heating treatment apparatus 40 are further suppressed, as compared to the dual-ring shutter structure. Further, since the temperature to which the introduced downflow reaches before it is supplied from the gap $d_1$ as the first gas inlet is further increased, a difference between the temperature of the supply air A supplied into the heat treatment space S from the gap $d_1$ and the temperature of the wafer W is further reduced, so that the thermal influence upon the wafer W is further suppressed, and more uniform heating can be achieved.

In the above-described exemplary embodiment, the side surface unit of the heating treatment apparatus is formed by the shutter member 250 configured to be moved up and down. However, the exemplary embodiment is not limited thereto, and, by way of non-limiting example, the heating treatment apparatus may have a typical sidewall structure which is not moved up and down. In such a case, a carry-in/out of the wafer W into/from the heat treatment space S may be performed by using a shutter provided at a part of the sidewall. Furthermore, the exemplary embodiment may also be applicable to a heating treatment apparatus having a configuration in which a ceiling plate itself is configured to be opened, and the wafer W is carried into or out of the heat treatment space from above the heat treatment space.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

INDUSTRIAL APPLICABILITY

The exemplary embodiment has advantages when it is applied to heat a substrate.

We claim:

1. A heating treatment apparatus configured to heat a substrate having a coating film formed thereon, the heating treatment apparatus comprising:
   a placing table configured to place the substrate thereon;
   a heating device configured to heat the substrate placed on the placing table;
   a top surface unit provided above the placing table and configured to cover the placing table; and
   a side surface unit configured to surround the placing table and located at an outer periphery of the placing table,
   wherein a heat treatment space is formed by the placing table, the top surface unit and the side surface unit,
   an exhaust unit configured to exhaust an atmosphere within the heat treatment space is provided at a central portion of the top surface unit,
   a first gas inlet and a second gas inlet are provided in a circumferential direction of the side surface unit and through which a gas is supplied into the heat treatment space,
   a height position of the first gas inlet is on a level with a height position of the substrate placed on the placing table, and a height position of the second gas inlet is higher than the height position of the first gas inlet, and
   a flow rate of the gas introduced into the heat treatment space from the first gas inlet is larger than a flow rate of the gas introduced into the heat treatment space from the second gas inlet,
   wherein the top surface unit does not have a slope rising from a side end portion to a center portion.

2. The heating treatment apparatus of claim 1,
   wherein a ratio between the flow rate of the gas introduced into the heat treatment space from the first gas inlet and the flow rate of the gas introduced into the heat treatment space from the second gas inlet is in a range from 9:1 to 6:4.

3. A heating treatment apparatus configured to heat a substrate having a coating film formed thereon, the heating treatment apparatus comprising:
   a placing table configured to place the substrate thereon;
   a heating device configured to heat the substrate placed on the placing table;
   a top surface unit provided above the placing table and configured to cover the placing table; and
   a side surface unit configured to surround the placing table and located at an outer periphery of the placing table,
   wherein a heat treatment space is formed by the placing table, the top surface unit and the side surface unit,
   an exhaust unit configured to exhaust an atmosphere within the heat treatment space is provided at a central portion of the top surface unit,
   a first gas inlet and a second gas inlet are provided in a circumferential direction of the side surface unit and through which a gas is supplied into the heat treatment space,
   a height position of the first gas inlet is on a level with a height position of the substrate placed on the placing table, and a height position of the second gas inlet is higher than the height position of the first gas inlet, and
   the first gas inlet is larger than the second gas inlet,
   wherein the top surface unit does not have a slope rising from a side end portion to a center portion.

4. The heating treatment apparatus of claim 3,
   wherein a size ratio between the first gas inlet and the second gas inlet is in a range from 9:1 to 6:4.

5. The heating treatment apparatus of claim 1,
wherein the side surface unit is implemented by a shutter member allowed to be moved up and down.

6. The heating treatment apparatus of claim 5,
wherein when the substrate is heated, the shutter member is moved up, and the second gas inlet is formed by a gap between an upper end portion of the shutter member and the top surface unit.

7. A heating treatment apparatus configured to heat a substrate having a coating film formed thereon, the heating treatment apparatus comprising:
a placing table configured to place the substrate thereon;
a heating device configured to heat the substrate placed on the placing table;
a top surface unit provided above the placing table and configured to cover the placing table; and
a side surface unit configured to surround the placing table and located at an outer periphery of the placing table,
wherein a heat treatment space is formed by the placing table, the top surface unit and the side surface unit,
an exhaust unit configured to exhaust an atmosphere within the heat treatment space is provided at a central portion of the top surface unit,
a first gas inlet and a second gas inlet are provided in a circumferential direction of the side surface unit and through which a gas is supplied into the heat treatment space,
a height position of the first gas inlet is on a level with a height position of the substrate placed on the placing table, and a height position of the second gas inlet is higher than the height position of the first gas inlet, and
a flow rate of the gas introduced into the heat treatment space from the first gas inlet is larger than a flow rate of the gas introduced into the heat treatment space from the second gas inlet,
wherein the side surface unit is implemented by a shutter member allowed to be moved up and down,
wherein the shutter member comprises an outer shutter and an inner shutter configured as one body, and
the first gas inlet communicates with a path formed between the outer shutter and the inner shutter.

8. The heating treatment apparatus of claim 7,
wherein the outer shutter has a hollow structure.

9. A heating treatment method of heating a substrate, which has a coating film formed thereon, on a placing table within a heat treatment space, the heating treatment method comprising:
supplying, when heating the substrate, a gas horizontally toward the heat treatment space at a height position on a level with the substrate on the placing table from an outside of the heat treatment space, and supplying the gas toward the heat treatment space at a height position higher than the substrate on the placing table from the outside of the heat treatment space, while exhausting an atmosphere within the heat treatment space from above a center of the heat treatment space,
wherein a flow rate of the gas supplied from the height position on the level with the substrate is set to be larger than a flow rate of the gas supplied from the height position higher than the substrate,
wherein a top surface unit is provided above the placing table and configured to cover the placing table, and
the top surface unit does not have a slope rising from a side end portion to a center portion.

10. The heating treatment method of claim 9,
wherein a ratio between the flow rate of the gas supplied from the height position on the level with the substrate and the flow rate of the gas supplied from the height position higher than the substrate is in a range from 9:1 to 6:4.

* * * * *